United States Patent [19]
Craft et al.

[11] Patent Number: 4,965,526
[45] Date of Patent: Oct. 23, 1990

[54] HYBRID AMPLIFIER

[75] Inventors: Scott Craft; Henry L. Pfizenmayer; Frederick C. Wernett, all of Phoenix, Ariz.

[73] Assignee: Motorola Inc., Schaumburg, Ill.

[21] Appl. No.: 380,230

[22] Filed: Jul. 14, 1989

[51] Int. Cl.⁵ .............................................. H03F 3/68
[52] U.S. Cl. ...................................... 330/66; 330/295
[58] Field of Search .......... 330/66, 68, 124 D, 124 R, 330/286, 295, 311

[56] References Cited

U.S. PATENT DOCUMENTS

| | | | |
|---|---|---|---|
| 4,001,711 | 1/1977 | Knutson et al. | 330/66 |
| 4,465,979 | 8/1984 | Russo | 330/66 |
| 4,500,850 | 2/1985 | Grodinsky | 330/66 X |

Primary Examiner—Steven Mottola
Attorney, Agent, or Firm—Robert M. Handy

[57] ABSTRACT

Hybrid RF amplifiers of improved performance are obtained by arranging film resistors, metallization and other components on a circuit board so that symmetrical parts of the electrical circuit are arranged in a mirror symmetrical fashion about a line extending along the circuit board and by aligning symmetrical resistors either parallel or orthogonal to this line and by utilizing common ground metal regions to terminate resistors that are aligned and orthogonal to the mirror line and spaced apart but joined to a common ground at a single location.

17 Claims, 9 Drawing Sheets

HYBRID AMPLIFIER

FIELD OF THE INVENTION

This invention concerns electronic assemblies and, more particularly, hybrid amplifiers for operation at radio frequencies.

BACKGROUND OF THE INVENTION

It is known in the electronic arts to build electronic assemblies by mounting components and interconnections on circuit boards. Ceramics, such as for example alumina or beryllia, are much used for circuit boards because of their dimensional stability and excellent thermal properties.

Metal film conductors prepared by means well known in the art are used on circuit boards to provide interconnections and bonding pads for various components. Some components, as for example resistors, are also provided in film form on ceramic boards. Other components, as for example, IC's, transistors, diodes, capacitors and transformers are often provided in discrete form and mounted on and/or connected to metallized contact regions on the board. Methods for providing such are well known in the art.

A particular problem associated with electronic circuits and assemblies that must operate in the radio frequency (RF) range of 100-1000 MHz or higher is that the performance of such units is especially sensitive to parasitic R, C and L associated with the placement of the components and interconnections on the circuit board. Parasitics can adversely affect gain, bandwidth, stability and noise. Because of these parasitics, the performance of such circuits is less than ideal and there is a continuing need to provide RF circuits and assemblies, particularly hybrid RF amplifiers, in which the adverse affects of parasitics are reduced and improved performance obtained.

BRIEF SUMMARY OF THE INVENTION

It is an object of the present invention to provide RF circuits and assemblies having improved performance. It is a further objective to provide improved RF circuits and assemblies in which the adverse affects of parasitic R, C and/or L have been reduced. It is a still further objective to provide a hybrid RF amplifier having improved performance. It is an additional objective to provide an improved RF amplifier in the same or less board space.

These and other objects and advantages are achieved by, in a first embodiment, an electronic assembly comprising, first and second means for amplifying signals, each having input, reference and output terminals, wherein the output of the first amplifying means is coupled to the input of the second amplifying means, and board means for supporting and coupling the amplifying means, and having first and second metal regions for receiving, respectively, the first and second amplifying means, and a third metal region having portions extending at least partially along three sides of the first metal region and a fourth metal region having portions extending at least partially along three sides of the second metal region.

Where a dual amplifier is desired there is further provided third and fourth means for amplifying signals, each having input, reference and output terminals, wherein the output of the third amplifying means is coupled to the input of the fourth amplifying means,

2 and fifth and sixth metal regions for receiving, respectively, the third and fourth amplifying means, and a seventh metal region having portions extending at least partially along three sides of the fifth metal region and an eighth metal region having portions extending at least partially along three sides of the sixth metal region.

It is desirable that the first and fifth metal regions, the second and sixth metal regions, the third and seventh, and the fourth and eighth metal regions be arranged in mirror symmetrical relationship on either side of a common line. It is further desirable that a first resistive means be provided on the board extending between the third and seventh metal region across the common line and that the assembly include second and third resistive regions on the board extending, respectively, from the fourth and eighth metal regions toward a ninth metal region located on the common line.

Double bonding is preferably used to connect components mounted on the first, second, fifth and sixth metal regions to, respectively, opposed portions of the third, fourth, seventh and eighth metal regions extending along opposite sides of the first, second, fifth and sixth metal regions.

It is desirable that the assembly also comprise first resistor means coupled between a first terminal of the first amplifier means and ground, and second resistor means coupled between a second terminal of the first amplifier means and ground, third resistor means coupled between a first terminal of the third amplifier means and ground, and fourth resistor means coupled between a second terminal of the third amplifier means and ground, wherein the ground connections of the first, second, third and fourth resistors comprise a conductor coupled to ground at one location symmetrically located with respect to the first and third resistors and the second and fourth resistors.

In a preferred embodiment there is provided an RF amplifier comprising a circuit board having thereon conductors and film resistors, and first and second amplifying means on the circuit board, each amplifying means including at least two directly coupled amplifying elements and resistors and capacitors, wherein the amplifying means are arranged in mirror symmetric fashion on either side of a first direction extending along the board and wherein at least two film resistors in each amplifying means have ends terminating at a common conductor, each common conductor being oriented transverse to the first direction. It is desirable that the transverse oriented, resistor terminating, common conductors of each amplifying means be aligned and separated by a gap. It is further desirable that the aligned transverse oriented, resistor terminating, common conductors be coupled to a ground conductor of the amplifier by a common location. In the preferred embodiment there is further provided in each amplifying means a further film resistor having a longitudinal direction oriented transverse to the first direction, wherein the longitudinal directions of the further film resistors are aligned.

The operation and scope of the invention summarized above will be better understood by considering the accompanying drawings and the explanation that follows.

DETAILED DESCRIPTION OF THE DRAWINGS

Figure 1:
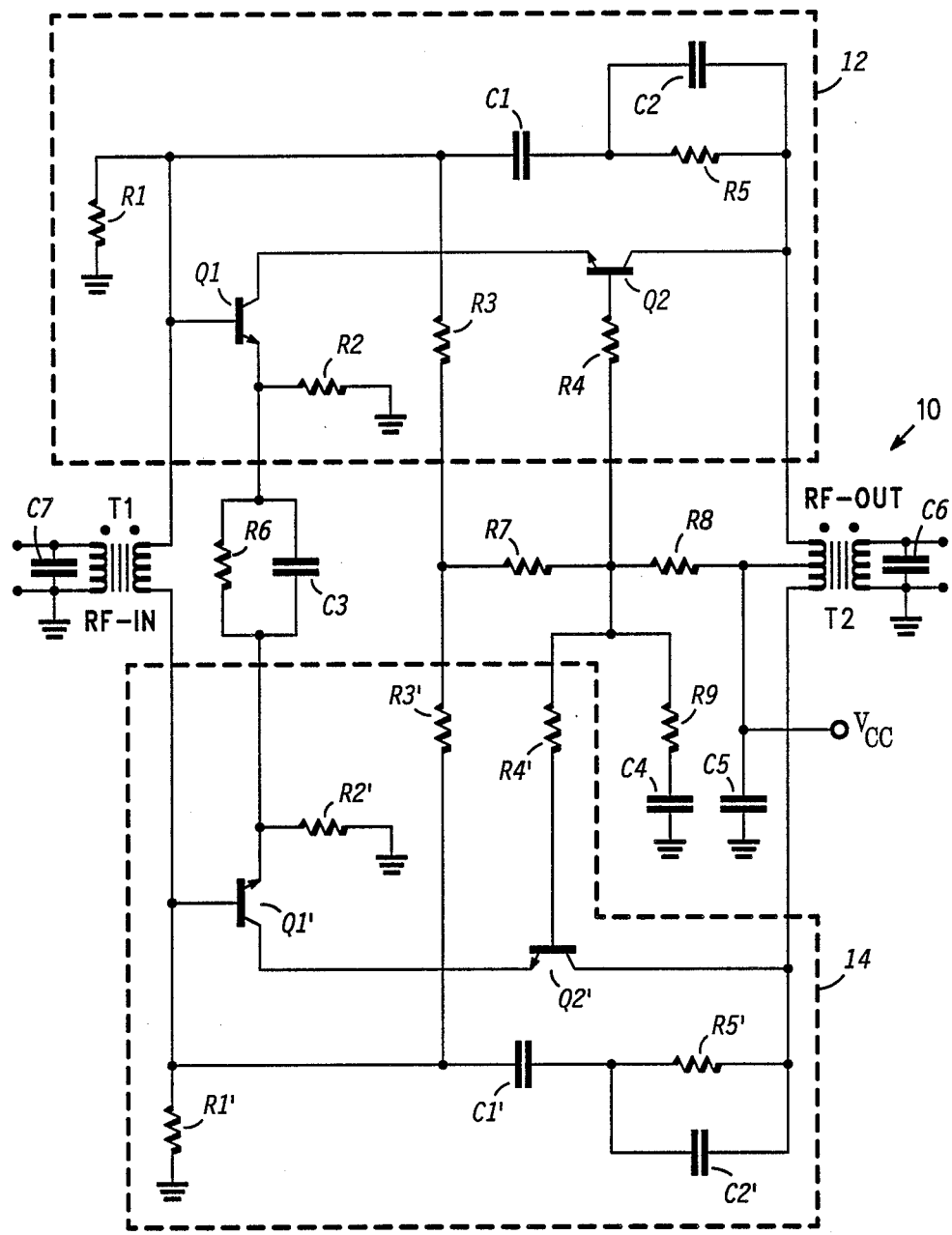
FIG. 1 is a simplified circuit diagram of a dual RF Cascode amplifier according to the prior art.

FIG. 1 is a diagram of circuit 10 of a dual RF Cascode amplifier according to the prior art. As those of skill in the art will appreciate, circuit 10 is highly simplified in that is does not show the R, C and/or L parasitics that are present in any physical implementation of circuit 10. These parasitics can have a profound influence on the actual circuit performance, especially at high frequencies.

Circuit 10 comprises two substantially identical push-pull circuit portions 12, 14, indicated by the dashed lines in FIG. 1. Each circuit portion 12, 14 contains substantially similar components interconnected in the same way and comprising, resistors R1-5, R1'-5', capacitors C1-C2, C1'-C2' and amplifying means Q1-Q2, Q1'-Q2'. Circuit portions 12, 14 are supplied in a push-pull fashion by RF input transformer T1 and the amplified signal is extracted through RF output transformer T2. Resistor R6 and capacitor C3 through the effect of a virtual ground provide a means of independently controlling the AC emitter impedance of Q1, Q1' with no effect on the DC emitter impedance.

DC power (Vcc) is supplied to circuit 10 through resistors R7, R8 and T2. Capacitor C5 is an RF by-pass capacitor. Resistor R9 and capacitor C4 are optional. Optional output shunt capacitor C6 assists in controlling the high frequency gain and output impedance of circuit 10. Optional input shunt capacitor C7 assists in controlling the high frequency input impedance of circuit 10. Bipolar transistors are typically used for amplifying means Q1, Q2, Q1', Q2' because of their excellent high frequency properties but other types of RF amplifying components, IC's or sub-assemblies may also be used. Optional capacitors (not shown) may also be provided from the bases of Q1, Q1' to ground to assist in input impedance matching.

For convenience of explanation, the present invention will be described for the situation where bipolar transistors are employed for Q1, Q2, Q1', Q2', but those of skill in the art will understand based on the description herein how other types of RF amplifying components, IC's or sub-assemblies may be used. RF-MOSFETS are an example of a suitable alternative amplifying component.

Input amplifiers Q1, Q1' are operated in a base-input, common-emitter configuration. The collector-outputs of transistors Q1, Q1' are directly connected to the emitter-inputs of Q2, Q2', respectively, which are operated in the common-base configuration. The collector-outputs of Q2, Q2' are connected to each end of the primary windings of RF output transformer T2. Series feedback elements R2, R2' R6 and C3 and shunt feedback elements C1-C2, R5 and C1'-C2', R5' assist in stabilizing the amplifier and reducing distortion, and in controlling gain and input-output impedance. The functions of the the other resistors and capacitors of circuit 10 are well understood in the art.

While balanced cascode amplifier circuit 10 is conceptually simple, the physical realization is quite complex where operation at very high frequencies, especially RF frequencies (100–1000 MHz or more) is intended. This is because, any physical realization inevitably introduces parasitic R, C, and/or L which tend to degrade performance from the ideal represented by circuit 10. It is the management of these parasitics that determines the ultimate performance of the physical circuit. These parasitics are primarily determined by the layout of the components and interconnections on the circuit board.

FIGS. 2–5 show simplified plan views of prior art circuit board 20 on which circuit 10 is implemented at various stages of manufacture and FIGS. 6–9 show analogous circuit board 40 implementing circuit 10 according to the present invention. Circuit boards 20, 40 measure approximately 13×25 mm in area.

In FIGS. 2–9, metal bonding and interconnection regions are shown as light grey or lightly stippled regions and film resistors are shown as darker grey or more heavily stippled regions. To facilitate comparison between FIG. 1 and FIGS. 2–9, the same designators, e.g., R1-R9, C1-C6 and Q1-Q2 (primed and un-primed) have been used on FIGS. 2–9 as on circuit 10 of FIG. 1. The letters "G" on FIGS. 2–9 indicate various ground (i.e., common return) regions. Thus, each region of boards 20 or 40 may be related to the corresponding component or connection of circuit 10.

Referring now to FIGS. 2–5, FIG. 2 is a simplified plan view of circuit board 20 with metal regions and film resistors provided thereon. Methods for fabricating such boards with patterned metallization and film resistors are well known in the art. Either thick or thin film fabrication technologies may be employed.

Figure 2:
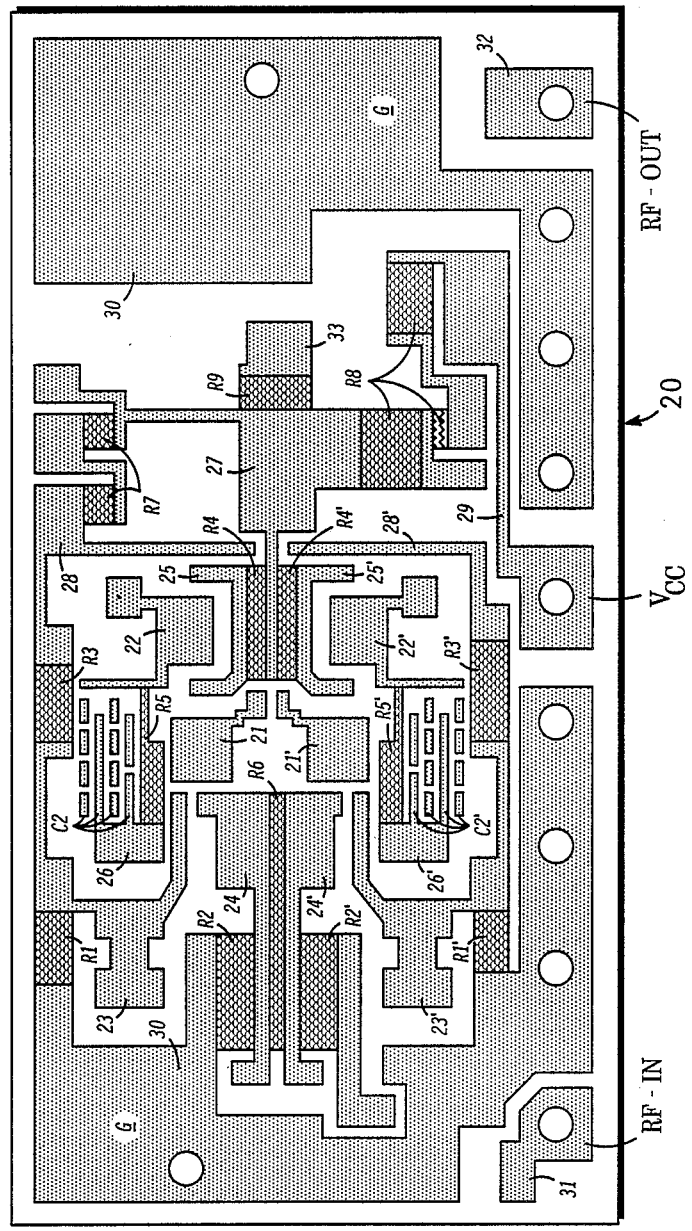
FIGS. 2–5 are simplified plan views of a hybrid implementation of the circuit of FIG. 1 according to the prior art and at various stages of manufacture.
Figure 3:
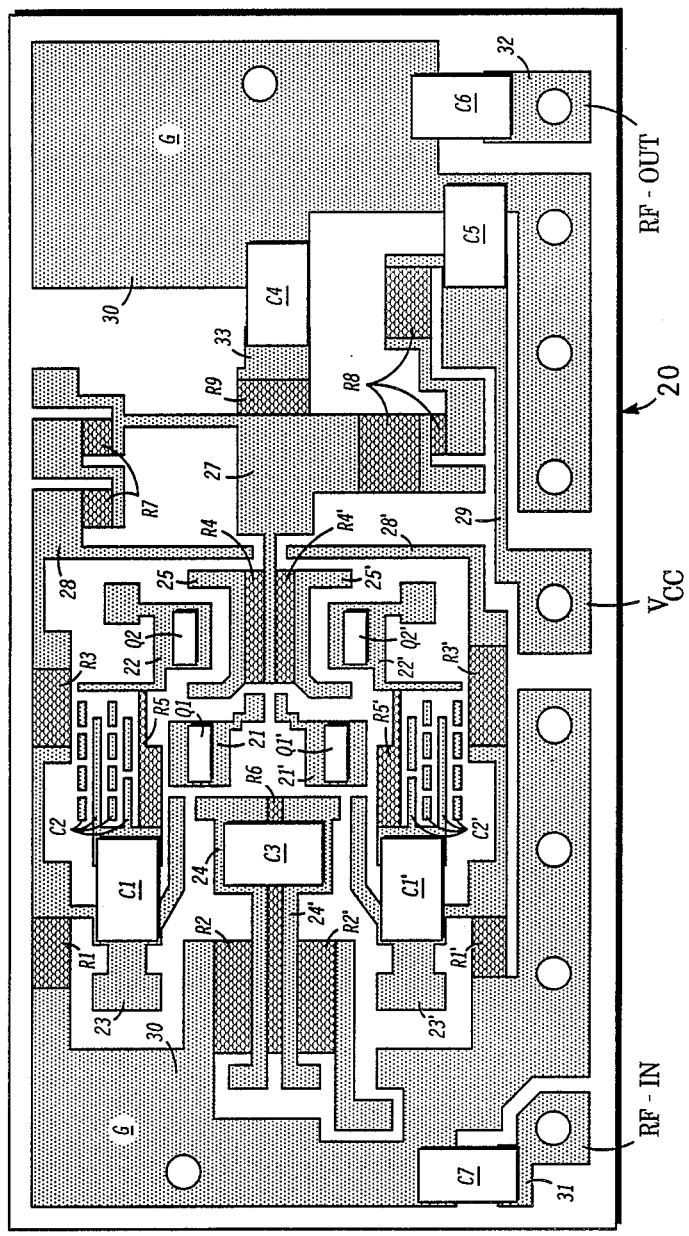

FIG. 3 shows the same board as in FIG. 2 but with the chip capacitors C1-C6, C1'-C6' and bipolar transistors Q1,Q2, Q1',Q2' added. These are typically soldered in place but any convenient attachment method consistent with the electrical and thermal requirements may be used. Such methods are well known in the art.

Figure 4:
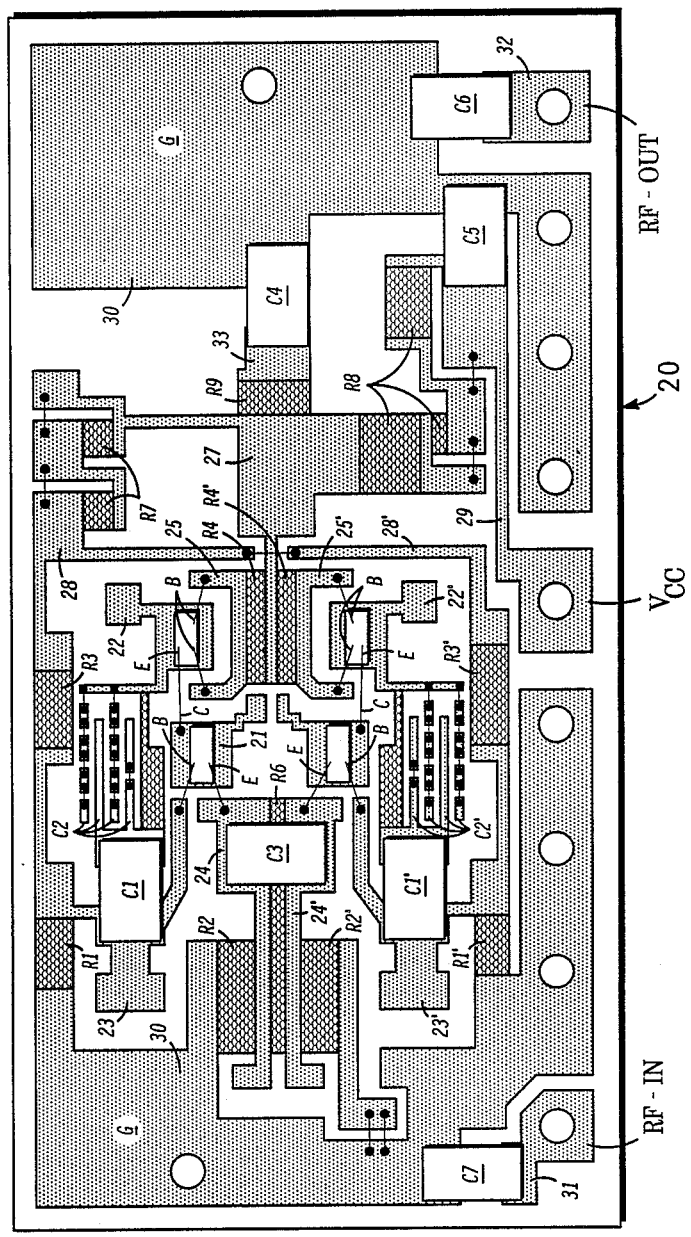

FIG. 4 shows the same board as in FIG. 3 but with various additional interconnections provided, as for example, by wire bonding. As those of skill in the art will appreciate, certain of the wire bonded connections are discretionary, as for example, those bridging across various portions of R7 or R8 so as to permit adjustment of their resistances or C2, C2' to permit adjustment of their capacitances.

Figure 5:
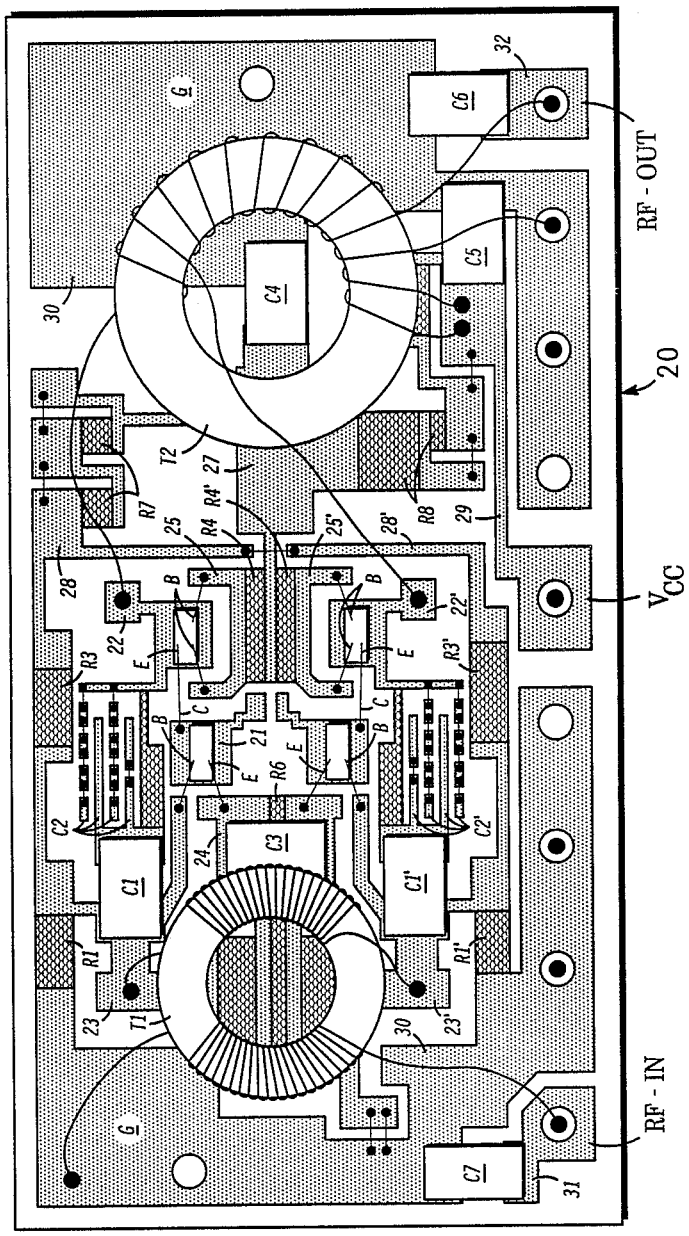
Figure 6:
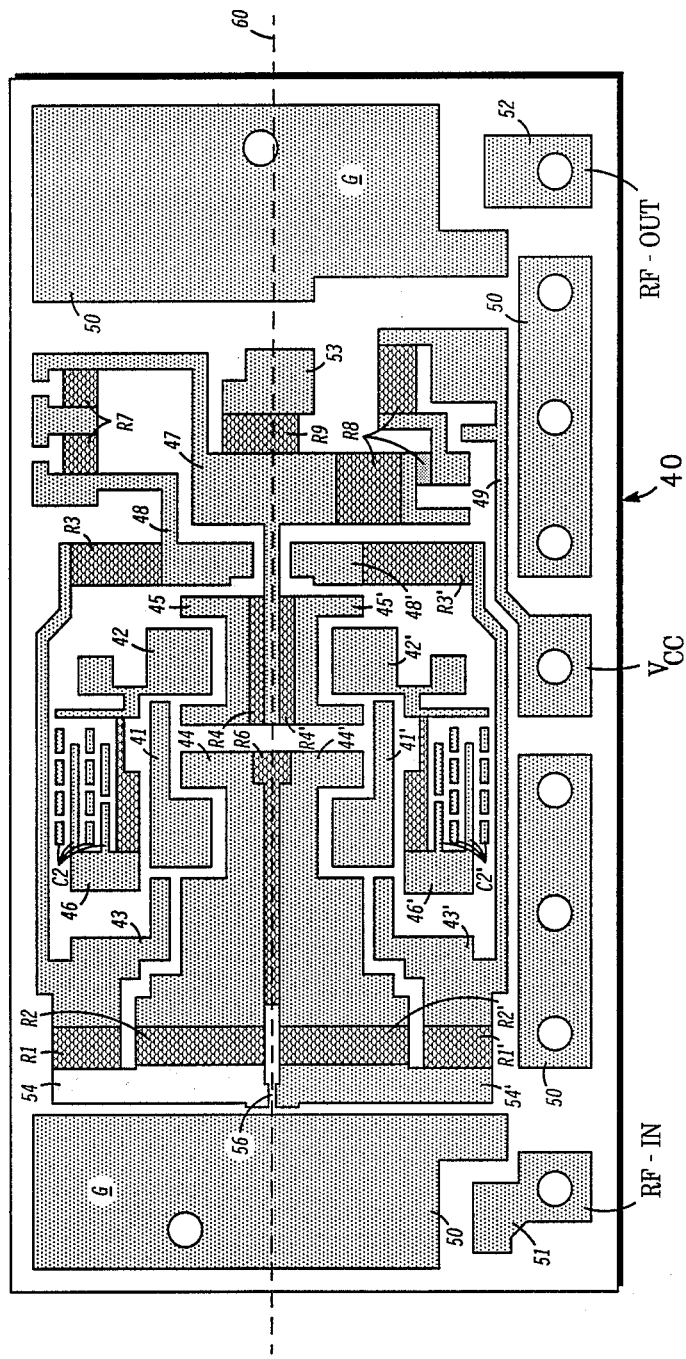
FIGS. 6–9 are simplified plan views of a hybrid implementation of the circuit of FIG. 1 analogous to FIGS. 2–5 and at various stages of manufacture, but according to the present invention.
Figure 7:
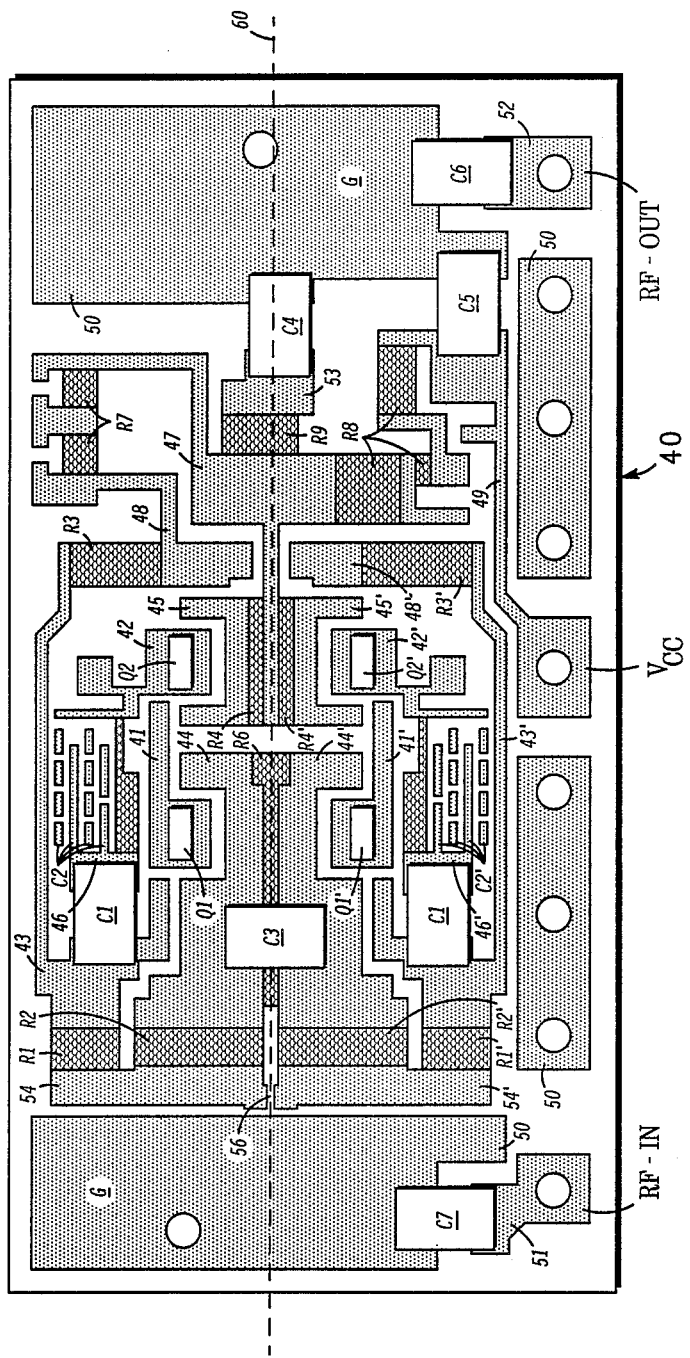
Figure 8:
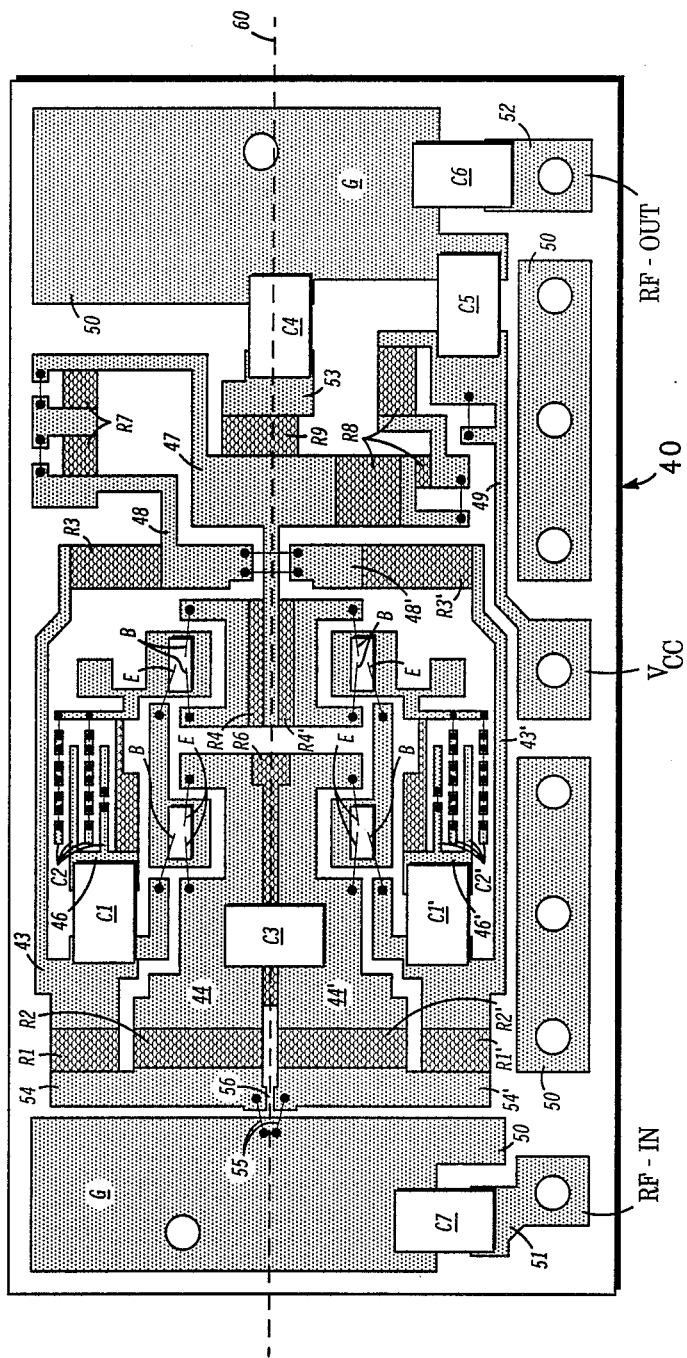
Figure 9:
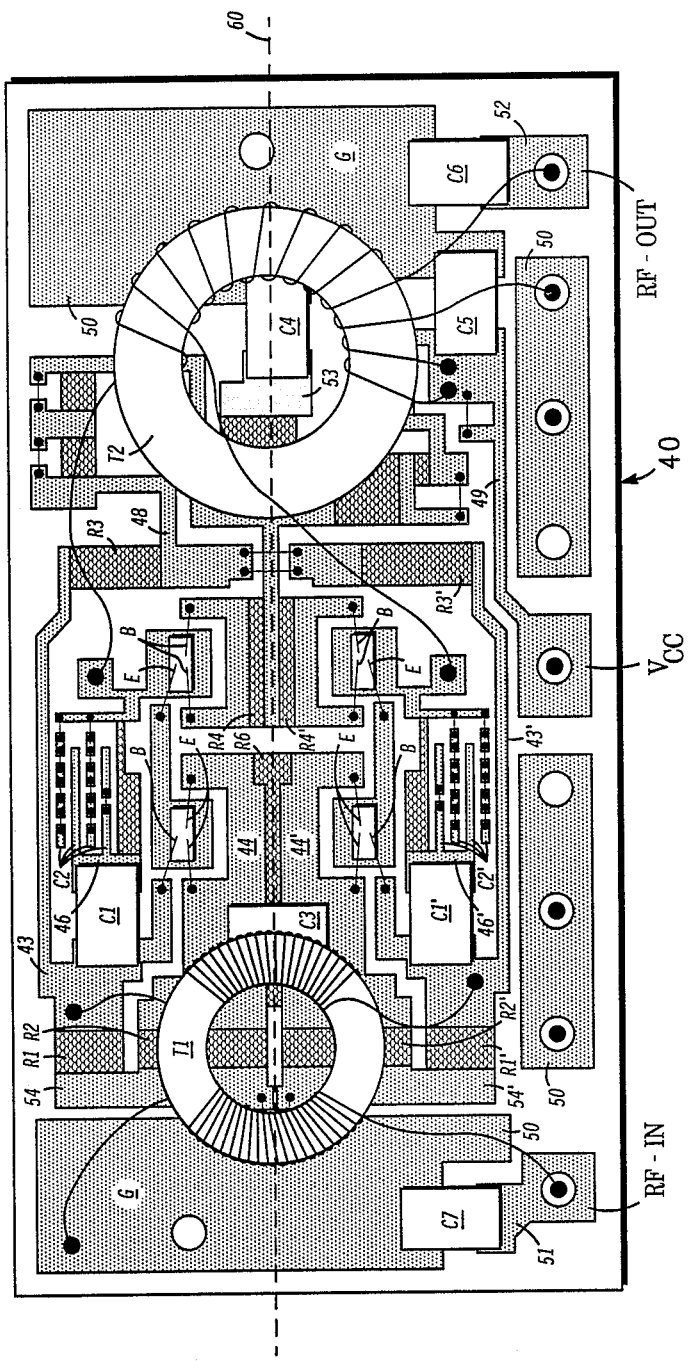

FIG. 5 shows the same board as in FIG. 4 but with transformers T1, T2 added. The circuit is now complete.

For simplicity, the connection and arrangement of the un-primed components will be described in detail. Those of skill in the art will understand that a corresponding set of connections and arrangements are provided for the primed components indicated in portion 14 of circuit 10 (FIG. 1) and on FIGS. 2–5. The same convention is also followed with respect to FIGS. 6–9.

Referring now to FIGS. 2–5, metal region 21 is provided for mounting the collector of transistor Q1 and providing a bonding location for connecting the collector of Q1 to the emitter of Q2. Metal region 22 is provided for mounting the collector of transistor Q2, for providing a terminus for resistor R5 and for providing a terminus for bonding to capacitor C2. Capacitor C2 is formed by the side-by-side interrupted metal regions indicated at that location on board 20. The magnitude of C2 is adjusted by bonding together one or more lengths of metal (see FIG. 3). The capacitance of C2 is very small.

Metal region 23 interconnects resistors R1 and R3, provides one terminus for capacitor C1 and provides a terminus for wire bonding to the base of transistor Q1. Metal region 24 provides a terminus of resistor R2 and a bonding location for bonding to the emitter of Q1, and provides a terminus for resistor R6 and capacitor C3. Metal region 25 provides a terminus for resistor R4 and a bonding location for bonding to the base of Q2. Metal region 26 provides the other plate of the side-by-side metal regions forming capacitor C2 and provides the other terminus for capacitor C1. Metal region 27 provides the other terminus for resistor R4 and a terminus for resistors R7–R9. Metal region 28 interconnects resistors R3 and R7. Metal region 29 connects resistors R8 to Vcc. Metal regions 30 are ground (i.e., common return) connections. Metal regions 31, 32 provide connections for RF-IN and RF-OUT respectively and metal region 33 provides a terminus for capacitor C4 whose other terminus is connected to an adjacent ground region 30. The other ends of resistors R1, R2 and capacitors C4, C5 are coupled to other adjacent ground regions 30.

The corresponding metal regions in primed portion 14 of the dual amplifier are indicated on FIGS. 2–5 by the same numbers with a prime symbol and, as those of skill in the art will understand, provide corresponding connections to the primed and other components.

While prior art realizations of circuit 10, as exemplified by FIGS. 2–5, give good performance, further improvement is desired. The present invention is concerned with improving the performance primarily through rearrangement of the physical layout of the components and connections on the circuit board. These re-arrangements also allow the magnitude of some of the components shown in circuit 10 to be adjusted to more favorable ranges, further contributing to improved performance. FIGS. 6–9 show simplified plan views of an improved physical realization of circuit 10, analogous to FIGS. 2–5, but according to the present invention.

The locations of the various components on circuit board 40 have been marked in the same way as in FIGS. 2–5 to correspond to the components indicated in circuit 10. Metallized regions 41–53 identified in FIGS. 6–9 are analogous to metallized regions 21–33, respectively, and correspond to the same interconnections in circuit 10. The dimensions of circuit board 40 are the same as circuit board 20 and no additional board space is required. By comparing FIGS. 2–5 and 6–9 it will be apparent to those of skill in the art that the location and extent of metallization regions 41–53 have been modified as compared to metallization regions 21–32 and the position of various components arranged. It has been found that the arrangement illustrated in FIGS. 6–9 gives significantly improved performance.

EXAMPLE

Amplifiers implementing circuit 10 were constructed according to prior art layouts and arrangements and according to the present invention shown in FIGS. 6–9. Bipolar transistor chips having $f_t$ values of at least 6 GHz were used for Q1, Q1', Q2, Q2'. The amplifiers were tuned to operate in the range of 40–550 MHz and had nominal inband gains of about 18 db with matched loads. Other things being equal, it was found that the improved arrangement of the present invention provided greater gain at high frequencies, e.g., at least 1 db greater at 550 MHz. This is a significant improvement.

The improved layout of the present invention also gave much better gain stability. Gain stability describes the propensity of the amplifier to break into oscillations when, for example, the load impedance is varied. This is an important property of RF amplifiers. Typically such oscillations occur at out-of-band frequencies above the intended upper cut-off frequency of the amplifier, for example, in the range 750–1200 Mhz for a typical prior art 40–550 MHz amplifier. Such conditions are familiar to those of skill in the art and are a significant design problem in RF circuits. Absolutely stable amplifiers are much desired but have not been possible with the prior art arrangements. At certain output impedance conditions, the gain and phase shift of the prior art amplifiers are such that oscillations may occur.

It was found that although generally well behaved, the prior art amplifiers become unstable under certain output impedance mis-match conditions, whereas the improved arrangement of FIGS. 6–9 does not. The improved amplifiers of the present invention have much better out-of-band gain stability.

In addition, it was determined that because of the improved out-of-band gain stability, the value of resistors R4, R4' which have previously been required to be comparatively high (e.g., 40 ohms) to achieve adequate circuit stability could be reduced to much smaller values (e.g., 5 ohms) thereby also substantially reducing amplifier distortion. A composite triple beat distortion reduction of at least 1 db is obtained in this way. This is very significant. The various modifications that provide these performance improvements are explained in more detailed below.

Referring now to FIGS. 6–9, the physical arrangement of the components enclosed in the amplifier portions within dashed lines 12, 14 of FIG. 1 have been modified to provide as nearly perfect physical mirror symmetry about line 60 as possible. This more perfect mirror symmetry provides a much improved virtual ground between circuit portions 12, 14 along line 60. This greatly reduces the effect of parasitics associated with circuit portions 12, 14. Several important aspects of these changes contribute to reducing the parasitic effects.

For example, resistors R1, R2 (and counterparts R1', R2') have been reoriented so that current flow therein is substantially parallel to mirror line 60 and so that resistors R1, R2 are substantially aligned and terminate on newly provided common conductor 54 (resistors R1', R2' are also aligned and terminate on newly provided common conductor 54'). The longer dimensions of R1, R2 (and R1', R2') are transverse to line 60 in this example, but this depends on the desired resistance values or ratios.

Common conductors 54, 54' which are symmetrical about mirror line 60 and oriented transverse thereto have been added. It is desirable that common conductors 54, 54' be separated by a gap so that the resistors and circuit portions 12, 14 can be individually tested during manufacture. Spaced-apart common conductors 54, 54' are then joined together and to adjacent ground region 50 by conductors 55 (see FIG. 8) so that there is substantially only a single symmetric ground connection location for common conductors 54, 54'. This eliminates asymmetrical return current flow in ground region 50 near input 51 further improving the balance between circuit portions 12, 14.

In addition, metal regions 44, 44' and 45, 45' have been enlarged with respect to prior art regions 24, 24' and 25, 25'. These changes, as long with the addition of common conductors 54, 54', reduce the parasitic inductance associated with R2, R2', R4, R4', R6 and, as explained further below, the leads coupled to the Q1, Q1', Q2, Q2'.

A further improved feature of the arrangement of FIGS. 6–9 is that metal region 44 is arranged to have a U-shaped portion that extends along three sides of metal region 41 on which Q1 is mounted so that the emitter connections to Q1 may be double bonded from opposite arms of the U. This substantially reduces the parasitic inductance and resistance of the emitter connection to Q1 and materially improves performance. The combination of the double bonded emitter of Q1 permitted by the U-shaped portion of metal region 44 and the double bonded base of Q2 permitted by the U-shaped portion of metal region 45 is also a new feature. Metal regions 44' and 45' have the same features, mirror symmetric about line 60.

A still further improved feature of the embodiment illustrated in FIGS. 6–9 is that resistor R3 has been rearranged to have current flow transverse to mirror line 60 and relocated so as to reduce the parasitic coupling to capacitor C2 and to provide the additional space needed for the U-shaped arms of metal region 44. Locating resistor R3 farther from capacitor C2 decouples the symmetrical amplifier circuitry from the bias chain associated with resistors R7, R8 and conductors 47, 48. This helps eliminate feedback of distortion components present on conductor 47. The same modifications have been made to resistor R3' and associated conductors, so that the arrangement of R3, R3' is symmetrical about line 60 and both R3, R3' and C2, C2' are less affected by the proximity of the non-symmetrical portions of circuit 10. This reduces the effects of the parasitics associated with these resistors, capacitors and connecting leads. In the particular embodiment shown, the longer dimensions of R3, R3' are transverse to line 60, but this depends on the desired resistance values or ratios.

It will be appreciated by those of skill in the art that the invented arrangement provides improved performance over the prior art, for example, greater gain-bandwidth and better gain stability margin, using substantially the same components and with the same or smaller board space. These are significant improvements which are especially valuable in connection with RF amplifiers. It will also be observed that the improved layout lends itself more readily to shrinking the overall circuit board area.

While the present invention has been illustrated in terms of particular types of amplifying means and other components, those of skill in the art will appreciate that the present invention applies equally well to other choices of amplifying means and components and various other circuits, and that, based on the teachings herein, those of skill in the art will understand how to make such variations without undue experimentation. Accordingly, it is intended to include such variations and equivalents in the claims that follow.

We claim:

1. A high frequency electronic assembly, comprising:
first and second transistor chips for amplifying signals, each having input, reference and output terminals, wherein the output of the first chip is coupled to the input of the second chip; and
board means for supporting and coupling components, including the transistor chips, and having first and second metal regions to which, respectively, the first and second chips are attached, and a U-shaped third metal region extending at least partially around three sides of the first metal region and a fourth U-shaped metal region extending at least partially around three sides of the second metal region.

2. A high frequency electronic assembly, comprising:
first and second means for amplifying signals, each having input reference and output terminals, wherein the output of the first amplifying means is coupled to the input of the second amplifying means;
board means for supporting and coupling components, including the amplifying means, and having first and second metal regions for receiving, respectively, the first and second amplifying means, and a third metal region having portions extending at least partially along three sides of the first metal region and a fourth metal region having portions extending at least partially along three sides of the second metal region;
third and fourth means for amplifying signals, each having input, reference and output terminals, wherein the output of the third amplifying means is coupled to the input of the fourth amplifying means; and
fifth and sixth metal regions for receiving, respectively, the third and fourth amplifying means, and a seventh metal region having portions extending at least partially along three sides of the fifth metal region and an eighth metal region having portions extending at least partially along three sides of the sixth metal region.

3. The assembly of claim 2 wherein the first and fifth metal regions, the second and sixth metal regions, the third and seventh, and the fourth and eighth metal regions are arranged in mirror symmetrical relationship on either side of a common line.

4. The assembly of claim 3 further comprising a first resistive means on the board extending between the third and seventh metal region across the common line.

5. The assembly of claim 3 further comprising second and third resistive regions on the board extending, respectively, from the fourth and eighth metal regions toward a ninth metal region located on the common line.

6. A dual balanced cascode RF amplifier comprising:
first and second cascode connected transistors, each having base, emitter and collector;
third and fourth cascode connected transistors, each having base, emitter and collector;
input means coupled to the bases of the first and third transistors;
first connection means having separated portions coupled, respectively, to the emitters of the first and third transistors and which partly enclose three sides of the first and third transistors;
output means coupled by second connection means to the collectors of the second and fourth transistors;
third connection means having separated portions coupling, respectively, the collectors of the first and third transistors to the emitters of the second and fourth transistors; and fourth connection means having separated portions which, respectively, at least partly enclose three sides of the second and fourth transistors.

7. The amplifier of claim 6 wherein the separated portions of the first connection means are, respectively, double bonded to the emitters of each of the first and third transistors from opposite sides thereof and the separated portions of the fourth connections means are, respectively, double bonded to the bases of each of the second and fourth transistors from opposite sides thereof.

8. The amplifier of claim 6 further comprising:
first resistor means coupled between the base of the first transistor and ground, and second resistor means coupled between the emitter of the first transistor and ground;
third resistor means coupled between the base of the third transistor and ground, and fourth resistor means coupled between the emitter of the third transistor and ground;
wherein the ground connections of the first, second, third and fourth resistors comprise a common conductor coupled to ground at one location symmetrically located with respect to the first and third resistors and the second and fourth resistors.

9. The amplifier of claim 8 further comprising fifth and sixth resistor means coupled, respectively, from the bases of the second and fourth transistors to a common point, and seventh and eighth resistor means coupled, respectively, from the bases of the first and third transistors to common point, and wherein the first and second transistor, and the first, second, fifth and seventh resistor means form one portion of the dual cascode amplifier and the third and fourth transistors, and the third, fourth, sixth and eighth resistor means form another portion of the dual cascode amplifier, and wherein the two portions have a completely mirror symmetric arrangement about a common line.

10. The amplifier of claim 9 wherein the mirror symmetric arrangement is around a first direction and the first through fourth resistor means comprise film resistors that are aligned along a second direction substantially at right angles to the first direction.

11. An RF amplifier comprising:
a circuit board having thereon conductors and film resistors;
first and second amplifying means on the circuit board, each amplifying means including at least two directly coupled amplifying elements and resistors and capacitors, wherein the amplifying means are arranged in mirror symmetric fashion on either side of a first direction extending along the board and wherein at least two film resistors in each amplifying means have ends terminating at a common conductor, each common conductor being oriented transverse to the first direction.

12. The amplifier of claim 11 wherein the transverse oriented resistor terminating conductors of each amplifying means are aligned.

13. The amplifier of claim 12 wherein the transverse oriented resistor terminating conductors of each amplifying means are separated by a gap.

14. The amplifying means of claim 13 wherein the aligned transverse oriented resistor terminating conductors are coupled to a ground conductor of the amplifier by a common connection.

15. The amplifier of claim 11 wherein each amplifying means comprises a further film resistor having a longitudinal direction oriented transverse to the first direction, wherein the longitudinal directions are aligned.

16. The assembly of claim 1 wherein the first and second transistor chips are attached, respectively to the first and second metal regions by major faces of the chips.

17. The assembly of claim 1 wherein the first and second transistor chips comprise bipolar transistors whose collector contacts are attached, respectively, to the first and second metal regions.

* * * * *